US008457281B2

(12) United States Patent
Enkisch et al.

(10) Patent No.: US 8,457,281 B2
(45) Date of Patent: Jun. 4, 2013

(54) METHOD FOR PRODUCING A MULTILAYER COATING, OPTICAL ELEMENT AND OPTICAL ARRANGEMENT

(75) Inventors: Hartmut Enkisch, Aalen (DE); Stephan Muellender, Aalen (DE); Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 244 days.

(21) Appl. No.: 12/965,280

(22) Filed: Dec. 10, 2010

(65) Prior Publication Data

US 2011/0222144 A1 Sep. 15, 2011

Related U.S. Application Data

(63) Continuation of application No. PCT/EP2009/003421, filed on May 14, 2009.

(60) Provisional application No. 61/061,038, filed on Jun. 12, 2008.

(30) Foreign Application Priority Data

Jun. 12, 2008 (DE) .......................... 10 2008 002 403

(51) Int. Cl.
 *G21K 1/06* (2006.01)
(52) U.S. Cl.
 USPC ............................................ 378/84; 359/359
(58) Field of Classification Search
 USPC ................. 378/34, 84, 85; 359/359; 427/160
 See application file for complete search history.

(56) References Cited

U.S. PATENT DOCUMENTS

| 4,993,824 | A | 2/1991 | Bluege |
| 6,011,646 | A | 1/2000 | Mirkarimi et al. |
| 6,309,705 | B1 | 10/2001 | Montcalm et al. |

(Continued)

FOREIGN PATENT DOCUMENTS

| DE | 100 11 547 A1 | 9/2001 |
| DE | 10 2004 002 764 A1 | 6/2004 |

(Continued)

OTHER PUBLICATIONS

Louis E. et. al., "Enhancement of Reflectivity of multilayer mirrors for soft x-ray projection lithography by temperature optimization and ion bombardment", Microelectronic Engineering, Elsevier Publishers BV., Amsterdam, NL, vol. 23, No. 1-4, Jan. 1, 2009, pp. 215-218.

*Primary Examiner* — Jurie Yun
(74) *Attorney, Agent, or Firm* — Sughrue Mion, PLLC

(57) ABSTRACT

A method for producing a multilayer coating (17) for reflecting radiation in the soft X-ray or EUV wavelength range on an optical element (8, 9) operated at an operating temperature ($T_{OP}$) of 30° C. or more, including: determining an optical design for the multilayer coating (17) which defines an optical desired layer thickness ($n_{OP} d_{OP}$) of the layers (17.1, 17.2) of the multilayer coating (17) at the operating temperature ($T_{OP}$), and applying the layers (17.1, 17.2) of the multilayer coating (17) with an optical actual layer thickness ($n_B d_B$) chosen such that a layer thickness change ($n_{OP} d_{OP} - n_B d_B$) caused by thermal expansion of the layers (17.1, 17.2) between the coating temperature ($T_B$) and the operating temperature ($T_{OP}$) is compensated for. Also provided are an associated optical element (8, 9) and a projection exposure apparatus having at least one such optical element (8, 9).

16 Claims, 4 Drawing Sheets

U.S. PATENT DOCUMENTS

| | | |
|---|---|---|
| 6,396,900 B1 | 5/2002 | Barbee, Jr. et al. |
| 6,465,272 B1 | 10/2002 | Davis, Jr. et al. |
| 6,738,188 B2 | 5/2004 | Singh |
| 6,884,361 B2 | 4/2005 | Goldstein |
| 6,931,097 B1 * | 8/2005 | Davis et al. ............... 378/84 |
| 7,081,949 B2 | 7/2006 | Hara |
| 2003/0123037 A1 | 7/2003 | Box |
| 2003/0164949 A1 | 9/2003 | Taylor et al. |
| 2005/0199830 A1 | 9/2005 | Bowering et al. |
| 2005/0270648 A1 | 12/2005 | Sekine |
| 2006/0007413 A1 | 1/2006 | Nanba |
| 2006/0008711 A1 | 1/2006 | Endo et al. |
| 2006/0192147 A1 | 8/2006 | Kandaka et al. |
| 2006/0221474 A1 | 10/2006 | Imai et al. |
| 2008/0088916 A1 | 4/2008 | Benoit et al. |
| 2008/0143981 A1 | 6/2008 | Ehm et al. |
| 2009/0009858 A1 | 1/2009 | Feigl et al. |

FOREIGN PATENT DOCUMENTS

| | | |
|---|---|---|
| DE | 102004015580 B3 | 7/2005 |
| DE | 10 2006 042 987 | 4/2008 |
| DE | 10 2008 017 888 A1 | 1/2009 |
| EP | 1372009 A1 | 12/2003 |
| JP | 2004-260043 A | 9/2004 |
| WO | 0108163 A1 | 2/2001 |
| WO | 2006/066563 A1 | 6/2006 |
| WO | 2007090364 A2 | 8/2007 |

* cited by examiner

METHOD FOR PRODUCING A MULTILAYER COATING, OPTICAL ELEMENT AND OPTICAL ARRANGEMENT

This is a Continuation of International Application PCT/EP2009/003421, with an international filing date of May 14, 2009, which was published under PCT Article 21(2) in German, and the complete disclosure of which, including amendments, is incorporated into this application by reference. The Continuation claims priority to U.S. Provisional Application No. 61/061,038, which has a U.S. filing date of Jun. 12, 2008, and the German Patent Application No. 10 2008 002 403.1, which also has a filing date of Jun. 12, 2008.

FIELD OF AND BACKGROUND OF THE INVENTION

The invention relates to a method for producing a multilayer coating for reflecting radiation in the soft X-ray or EUV wavelength range on an optical element and to an optical element which is operated at an operating temperature of 30° or more, preferably 100° C. or more, particularly preferably 150° C. or more, in particular of 250° C. or more, in an optical arrangement. The invention also relates to an optical arrangement comprising at least one optical element of this type.

Optical elements for the soft X-ray or EUV wavelength range (that is to say for wavelengths which typically lie between 5 nm and 20 nm) are used, inter alia, in optical arrangements such as projection exposure apparatuses for microlithography for the production of semiconductor components. Since no optical materials which have a sufficient transmission are known at these wavelengths, the optical elements are operated in reflection, the maximum reflectivity of the optical elements at these wavelengths typically being not more than approximately 70%, that is to say that approximately one third of the radiation impinging on a reflective optical element is not reflected and therefore does not impinge on the optical elements disposed downstream in the optical beam path. Accordingly, optical elements arranged further at the front in the beam path, that is to say closer to the EUV light source, are subjected to a considerably higher radiation loading and are heated to a much greater extent than is the case for optical elements situated further back in the beam path. Thus, by way of example, the temperature of a collector mirror which is the first optical element succeeding EUV light source, during operation of the optical arrangement, can amount to between approximately 200° C. and approximately 400° C. or higher. The temperature of the downstream optical elements in the illumination system can be 200° C. or more and temperatures of approximately 60° C. or higher can also occur even in the projection system of the optical arrangement.

The multilayer coatings of the optical elements used for reflecting radiation in the EUV wavelength range generally have alternate layers of materials having high and low refractive indices, e.g. alternate layers of molybdenum and silicon, the layer thicknesses of which are coordinated with one another in such a way that the coating can fulfill its optical function and, in particular, a high reflectivity is ensured. When the multilayer coatings of the optical elements are heated to the high temperatures mentioned above, however, thermal loadings of the multilayer coatings can occur which adversely affect the optical properties of the optical elements, as is explained in detail below.

WO 2007/090364 discloses that the substances molybdenum and silicon that are usually used as layer materials tend at high temperatures toward formation of molybdenum silicide as a result of interdiffusion processes at their interfaces, which leads to a reduction of the reflectivity on account of an irreversible decrease in the layer thickness of the layer pairs, which brings about a shift in the reflectivity maximum of the multilayer coating for the impinging radiation toward a shorter wavelength. In order to overcome this problem, WO 2007/090364 proposes using a silicon boride instead of silicon and a molybdenum nitride instead of molybdenum.

In order to solve this problem, DE 100 11 547 C2 proposes applying a barrier layer composed of $Mo_2C$ at the interfaces of the silicon and molybdenum layers, in order to prevent the interdiffusion between the layers and thereby to improve the thermal stability of the multilayer coating.

DE 10 2004 002 764 A1 in the name of the applicant discloses that the layers of a multilayer coating, when they are applied by means of specific coating methods, have an amorphous structure with a lower density than the corresponding materials as solids. The initially low density of the layers increases irreversibly at elevated temperatures, thus resulting in a reduction of the layer thicknesses of the individual layers and, in association with this, an increase in the period length of the coating. This likewise has the consequence that the wavelength at which the multilayer coating assumes a maximum of the reflectivity is shifted. In the extreme case, the period length can change to such an extent that the optical elements coated with the multilayer coating become unusable. In order to solve this problem, DE 10 2004 002 764 A1 proposes providing an oversize during the application of the layers, and anticipating the irreversible reduction of the layer thicknesses by heat treatment of the multilayer coating before the latter is used in an optical arrangement.

OBJECTS AND SUMMARY OF THE INVENTION

It is an object of the invention to provide a method for producing a multilayer coating, an optical element, and an optical arrangement, the optical properties of which are not impaired even at high operating temperatures.

This object is achieved with a method of the type mentioned in the introduction, comprising the following steps: determining an optical design for the multilayer coating which defines an optical desired layer thickness of the layers of the multilayer coating at the operating temperature, and applying the layers of the multilayer coating with an optical actual layer thickness chosen in such a way that a layer thickness change caused by thermal expansion of the layers between the coating temperature and the operating temperature is compensated for.

The invention proposes choosing the optical actual thickness of the layers during coating, which can be effected at room temperature, for example, in such a way that the thermal expansion of the layers during heating to the operating temperature leads to the optical desired layer thickness and thus to the desired optical design at operating temperature. In this case, the optical thickness of a layer is understood to mean, in the generally conventional way, the product of refractive index n and physical (geometrical) thickness d of the layer. In addition to the physical thickness of the layers, the refractive index of the layers can also change, if appropriate, in the event of a temperature change. It should be noted that the optical actual thicknesses of the individual layers can in each case be chosen per se such that the optical desired thicknesses are established at the operating temperature. As an alternative, however, for simplification purposes, it is possible to choose just the effective optical actual thickness of the entire multilayer coating in such a way that an effective optical desired thickness of the multilayer coating is established. Furthermore, the variation of the refractive index can often also be disregarded, with the result that only the geometrical actual layer thickness has to be adapted in such a way that the geometrical desired layer thickness is established at the operating temperature.

In contrast to the prior art, the reversible layer thickness change that arises as a result of the heating of the optical elements during the operation thereof at a high operating temperature is taken into account during the production of the multilayer coating. Since the coating is generally effected at a lower temperature than at the operating temperature, the actual layer thickness is generally chosen to be smaller than the desired layer thickness. It should be noted that the above-described measures known from the prior art for compensating for the irreversible change in the layer thicknesses can also be employed in addition. In particular, it is recommended, in the case of optical elements that are operated at temperatures of more than 100° C., to provide interlayers ("barrier layers") or, if appropriate, to replace silicon and molybdenum by more suitable heat-resistant layer materials.

In one advantageous variant, for determining the layer thickness change a linear thermal expansion coefficient of the layers of the multilayer coating is determined or at least one optical property of the optical element is measured at the operating temperature. Given a known temperature difference between coating temperature and operating temperature, the actual thickness of the layers can be calculated from the (physical) desired thickness of the layers in a simple manner by determining the thermal expansion coefficient, a linear thermal expansion coefficient that is constant over the temperature interval between coating temperature and operating temperature generally being taken as a basis in the calculation. It should be noted that in this case, for simplification purposes, a uniform thermal expansion coefficient of the entire multilayer coating, that is to say a thermal expansion coefficient averaged over the individual materials, can be determined or measured. As an alternative, the thermal expansion coefficient, which, if appropriate, is also dependent on the type of coating method, can be determined individually for each coating material. As an alternative or in addition, it is also possible for at least one optical property of the optical element to be measured at the operating temperature. In particular, it is possible in this case to measure the reflectivity as a function of the wavelength and/or the angle of incidence. In this case, it is possible successively to create a plurality of optical elements having different actual layer thicknesses and to measure the optical properties thereof at the operating temperature in order to ascertain the actual layer thicknesses at which the desired optical design is achieved. In coating methods in which the effect of the irreversible density increase mentioned in the introduction occurs, the layer thickness reduction initiated as a result can likewise be concomitantly taken into account in the determination of the actual layer thickness(es).

A relative thickness change of one per mille or more in the case of a temperature change of 150 K is taken as a basis in the case of typical multilayer coatings. In particular, in the case of a temperature change of 150 K, the relative distance between two successive layers of the multilayer coating with a high real part of the refractive index can also change by 1 per mille or more. For a traditional Mo/Si multilayer system, the inventors have determined a linear thermal expansion coefficient of approximately $0.8 \cdot 10^{-6}$ 1/K.

In one advantageous variant, the optical actual layer thickness is chosen to be equal to the optical desired layer thickness, and the coating of the optical element is effected at the operating temperature, the temperature of the optical element preferably being regulated to the operating temperature. In this case, the optical element is preferably heated homogeneously to the operating temperature during coating, such that the coating can be effected with an actual layer thickness which corresponds to the desired layer thickness. It is thereby possible to dispense with measuring the thermal expansion coefficient, with the result that no inaccuracies that possibly arise by virtue of the linear approximation can have the effect that the desired layer thicknesses of the optical design at the operating temperature cannot be achieved exactly. In this case, the temperature of the optical element can be held at the operating temperature e.g. using a regulable heating element. It should be noted that the optical element can also be heated inhomogeneously during coating, in order to simulate the temperature distribution that arises during operation on the optical element.

In a particularly preferred variant, the optical design of the multilayer coating of the optical element is optimized with regard to at least one temperature-dependent optical property, in particular the reflectivity of the optical element for the operating wavelength, at the operating temperature. Depending on the wavelength, the reflectivity of the multilayer coating has a distribution with a highly pronounced maximum whose wavelength ideally corresponds to the operating wavelength of the optical arrangement in which the optical element is intended to be operated. The full width at half maximum of the distribution is approximately 0.6 nm. In this case, the optical design has at the operating temperature desired layer thicknesses which are chosen in such a way that the reflectivity maximum is at the operating wavelength. As explained above, the wavelength of the reflectivity maximum changes with the period length of the layers of the multilayer coating, which increases as the temperature increases. The maximum of the reflectivity is correspondingly shifted toward higher wavelengths. The actual layer thicknesses of the optical design at the coating temperature are therefore detuned with regard to the desired layer thicknesses and chosen in such a way that at the operating temperature, the reflectivity maximum is established at the operating wavelength, in particular at 13.5 nm.

In one variant, the operating temperature of the optical element varies at least in one direction along the optical surface and, during the coating of the optical element the layers are applied with actual layer thicknesses which vary along the at least one direction. If a constant but inhomogeneous temperature increase occurs as a result of the heating of the optical element, it can be compensated for by a location-dependent detuning of the actual layer thicknesses relative to the desired layer thicknesses, which is also referred to as a so-called lateral gradient ("lateral grading"). It should be noted that a multilayer coating having a constant desired layer thickness does not necessarily have to arise at the operating temperature. Rather, the desired layer thicknesses can also have a lateral gradient, particularly if the average angle of incidence changes depending on the location on the optical surface, such that a location-dependent optimization of the layer thicknesses is necessary for producing a location-dependent maximum reflectivity of the optical element. It should be further noted that the location-dependent temperature increase, particularly in the case of optical elements arranged in the illumination system of an optical arrangement, can be dependent on the respective illumination settings. In this case, it is possible to perform an optimization corresponding to an "average" illumination setting, that is to say an optimization chosen in such a way that, for all illumination settings used, operation with satisfactory properties of the optical elements is still ensured.

A further aspect of the invention is realized in an optical element of the type mentioned in the introduction wherein the optical design of the multilayer coating is optimized with regard to at least one temperature-dependent optical property, in particular the reflectivity of the optical element for the operating wavelength, at the operating temperature. The optical element therefore has an optical design with which the maximum of the reflectivity for the operating wavelength (e.g. 13.5 nm) is not achieved at room temperature (22° C.), but rather only at the operating temperature, which is 30° C. or higher. It should be noted that in addition to the reflectivity, other optical properties of the optical element can also be optimized, e.g. if the optical element is arranged in an illumination system in the beam path downstream of a light mixing device that shapes an illumination field that is intended to be obtained up to the object plane. In this case, the optical design of an optical element at the operating temperature can be dependent on the properties of further optical elements, that is to say that the optical designs of a plurality of optical elements are adapted to one another in such a way that a global property of the optical arrangement, e.g. the uniformity or telecentricity thereof, at the operating temperature is optimized. Within the meaning of this application, "optimization" is typically understood to mean a maximization or minimization of an optical property, e.g. a maximization of the reflectivity of the optical element.

In one preferred embodiment the wavelength of the maximum of the reflectivity of the optical element at the operating temperature corresponds to the operating wavelength, the wavelength of the maximum of the reflectivity of the optical element at the operating temperature in particular being shifted relative to the wavelength of the maximum of the reflectivity of the optical element at room temperature by more than 2 per mille, if appropriate by more than 4 per mille, with respect to the operating wavelength. The optical design or the thicknesses of the layers are in this case chosen in such a way that the reflectivity maximum by assumed at the operating temperature and at a predetermined angle of light incidence. The shift in the intensity maximum by more than 2 per mille is achieved e.g. in the conventional Mo/Si layer systems at a temperature difference of approximately 250 K relative to room temperature, and a shift by 4 per mille at a temperature difference of approximately 500 K. Such high temperatures are achieved in particular at optical elements which are arranged in the illumination system of EUV lithography apparatuses in the beam path in the vicinity of the light source.

In one preferred embodiment, the reflectivity of the optical element at the operating temperature is maximized for an average angle of light incidence which lies between 0° and 30°, preferably between 5° and 20°, particularly preferably between 10° and 15°. In this case, the average angle of light incidence can vary in a location-dependent manner and the multilayer coating can have a lateral gradient in order to maximize the reflectivity of the optical element depending on the location on the optical surface.

If the operating temperature varies at least in one direction along the optical surface of the optical element, the multilayer coating, for optimizing the at least one property, preferably has a gradient of the layer thicknesses of the layers of the multilayer coating in the at least one direction. Providing a lateral layer thickness gradient makes it possible to adapt the optical design to the local operating temperature of the optical element. This is advantageous particularly at optical elements in which an optical design that is not adapted to the location-dependent variation of the temperature has direct effects on the optical properties of the overall system, which can be the case e.g. with mirrors near the field in the illumination system with regard to the uniformity.

In one advantageous variant, the optical element is embodied as a facet mirror having a plurality of individual mirrors, in each case at least one optical property of the individual mirrors at the operating temperature being optimized. In the case of facet mirrors having a plurality of individual mirrors in a generally matrix-type arrangement, the temperature differences can be taken into account in a location-dependent manner particularly simply by optimization of the coating of the respective individual mirrors for the local operating temperature. In this case, a respective constant thickness can be chosen for the layer thicknesses of the layers of the multilayer coating on the individual mirrors and an optical design optimized in a location-dependent manner can nevertheless be achieved relative to the entire facet mirror.

A further aspect of the invention is realized in an optical arrangement, in particular a projection exposure apparatus for EUV lithography, comprising: an illumination system for illuminating an object field, a projection system for imaging the object field onto an image field and at least one optical element as described above arranged in a beam path of the optical arrangement. The at least one optical element is in this case typically heated to the operating temperature by the light source and in subsequent operation of the optical arrangement, has a substantially constant operating temperature, possibly variable in a location-dependent manner, at which the at least one optical property is optimized.

In one particularly preferred embodiment, the optical design of the at least one optical element is chosen in such a way that at least one imaging aberration of the optical arrangement at the operating temperature of the optical element is optimized. It should be noted that for the optimization, that is to say generally for the minimization of the imaging aberrations of the optical arrangement, the optical designs of a plurality of optical elements which have different operating temperatures can also be jointly optimized or coordinated with one another.

In one preferred development, the imaging aberration is selected from the group comprising: telecentricity, uniformity, pupil ellipticity and pupil apodization. It should be noted that, if appropriate, not all the imaging aberrations can be optimized jointly, especially as they are generally also dependent on the illumination setting chosen. The optimization of the imaging aberrations is generally performed only on optical elements in the case of which a field to be imaged is already present, which is the case e.g. in the illumination system downstream of the light mixing device, which can be embodied e.g. as a fly's eye condenser.

In one advantageous embodiment, a gradient of the layer thicknesses of the layers of the multilayer coating of at least one optical element arranged in the illumination system in at least one direction is chosen in such a way that, at the operating temperature of the optical element, the uniformity in an object plane of the optical arrangement in the at least one direction is less than 5%, preferably less than 2%, in particular less than 1%. This can be achieved in particular when the optical element in the at least one direction is an optical element near the field, that is to say an optical element in the case of which spatial coordinates on the optical surface correspond to spatial coordinates of the object field. It should be noted that one and the same optical element can be near the field in the first direction and near the pupil in a second direction, which is typically perpendicular to the first direction, that is to say that in the second direction the locations on the optical surface correspond to angles in the object field of the optical arrangement.

Particularly preferably, the optical arrangement, during operation of the optical elements with their respective operating temperature for the operating wavelength, has a maximum total transmission which is preferably increased by 2% or more, in particular by 3% or more, relative to operation of the optical elements at room temperature. What can be achieved by a suitable definition—as described above—of the layer thicknesses in the case of the coating is that the optical arrangement has its maximum total transmission at operating temperature. In particular, as a result of this, the optical arrangement, during operation of the optical elements with their respective operating temperature for the operating wavelength, can have a maximum total transmission which is increased by 2% or more, in particular by 3% or more, relative to an (otherwise identical) optical arrangement which has a maximum total transmission during operation of the optical elements at room temperature for the operating wavelength, that is to say which was optimized for operation at room temperature.

The total transmission of the optical arrangement results as the product of the transmission of the illumination system and the transmission of the projection system, which can in each case be optimized per se by maximizing the reflectivity of each individual optical element of the optical elements arranged in the two systems. In this way, ideally congruent reflectivity curves arise for all the optical elements of the optical arrangement, which have their common maximum at the operating wavelength.

In this case, the total transmission is determined in a wavelength range of e.g. +/−1% around the operating wavelength (so-called "in-band" range). It should be noted that a transmission of the optical arrangement that is as homogeneous as possible should also be achieved, that is to say that the total transmission in a respective first image field point should deviate from the total transmission at a respective second image field point by not more than 2% relative to the larger value of the total transmission.

In one embodiment at least two optical elements that succeed one another in the beam path have a different operating temperature during operation of the optical arrangement. As explained above, different operating temperatures of the optical elements in the beam path arise by virtue of the fact that the optical elements reflect only in each case approximately 70% of the impinging radiation, such that the intensity of the radiation impinging on the optical surfaces decreases all the more, the further away they are from the light source. It should be noted, in particular, that the optical designs of the two optical elements are optimized for the respective operating temperature and the actual layer thicknesses of the layers of the two optical elements at room temperature therefore generally differ from one another.

In one particularly advantageous embodiment, at least one preferably regulable heating element is provided for preferably homogeneously heating the optical surface of at least one reflective optical element to the operating temperature. Since the operating temperature for which the optical design of the optical elements is designed is generally attained only after an operating time of the optical arrangement e.g. approximately 30 minutes, the optical element can be heated by the heating element, e.g. a heating wire, Peltier element, etc., in order to bring the optical element to the operating temperature more rapidly. In this case, it is appropriate to provide a regulation for the heating element in order to deactivate the heating element when the operating temperature is attained, or alternatively to maintain the chosen operating temperature if appropriate in the case of a change in the conditions during exposure, in particular in the case of a change in the illumination setting.

Further features and advantages of the invention will become apparent from the following description of exemplary embodiments of the invention, with reference to the figures of the drawing, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION OF EXEMPLARY EMBODIMENTS

Figure 1:
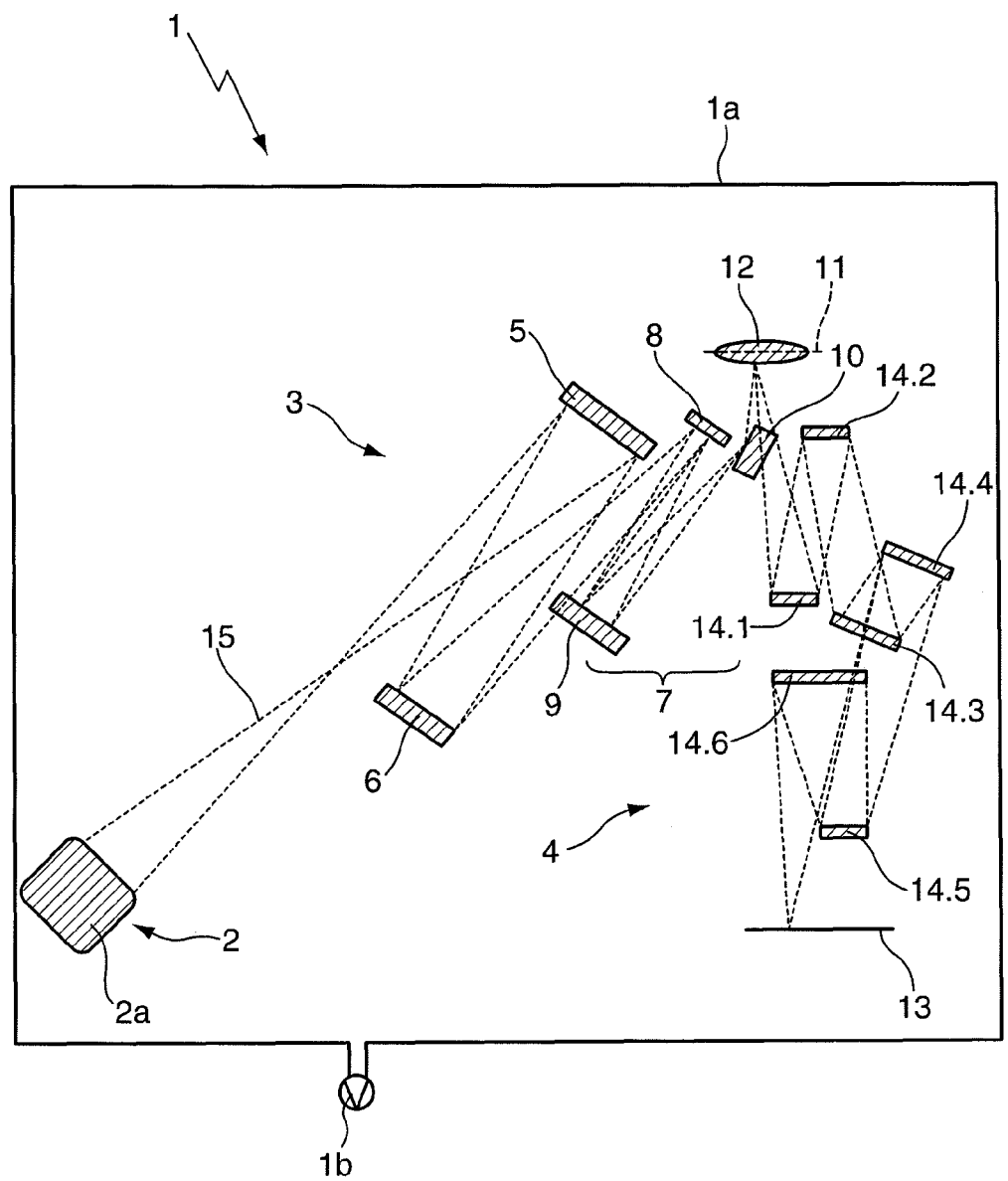
FIG. 1 shows a schematic illustration of an EUV lithography system according to the invention, FIGS. 2a,b show schematic illustrations of an optical element with a multilayer coating at coating temperature and at operating temperature in a first direction, FIGS. 3a,b show corresponding illustrations of the optical element in a second direction.

FIG. 1 shows a schematic illustration of a projection exposure apparatus 1 for EUV lithography, which has a housing 1a, to which a vacuum generating unit 1b (vacuum pump) is assigned. The housing 1a, in accordance with the optical function of the components arranged therein, is subdivided into three housing parts (not illustrated pictorially in FIG. 1), to be precise initially into a first housing part with a light generating unit 2 comprising e.g. a plasma light source (not shown) and an EUV collector mirror 2a for focusing the illumination radiation.

Arranged in a second housing part adjacent thereto is the illumination system 3, which, following the beam course, has a mirror with field raster elements 5 and a mirror with pupil raster elements 6 as light mixing device. A downstream group of three mirrors, which acts as telescope object 7, has a first and second mirror 8, 9, which are operated with normal incidence, and a third mirror 10 having a negative refractive power, on which the light impinges with glancing incidence. The illumination system 3 generates an image field that is as homogeneous as possible in an object plane 11, in which is arranged a reticle 12 with a structure (not shown) to be imaged in demagnified fashion.

The structure arranged on the reticle 12 in the object plane 11 is imaged onto an image plane 13 by a downstream projection system 4 arranged in a third housing part, a wafer having a photosensitive layer (not shown) being situated in said image plane. The projection system 4 has, for the demagnifying imaging, six further mirrors 14.1 to 14.6 as reflective optical elements.

During operation of the projection exposure apparatus 1, the optical elements 2a, 5, 6, 8 to 10 of the illumination system 3 which are situated in the beam path 15 of the light generating unit 2, and also the optical elements 14.1 to 14.6 of the projection system 4 are heated to different extents by the illumination radiation, in which case, after a warm-up phase, which can be approximately 30 minutes, it sets a static state in which the optical elements 2a, 5, 6, 8, 9, 10, 14.1 to 14.6 attain their respective operating temperatures. The operating temperature of a respective optical element depends on how many further optical elements are arranged between it and the light generating unit 2, since in the optimal case only approximately 70% of the incident radiation can be reflected at each of the optical elements 2a, 5, 6, 8, 9, 10, 14.1 to 14.6.

As described above, the temperature of the optical elements 2a, 5, 6, 8, 9, 10, 14.1 to 14.6 during operation of the projection exposure apparatus 1 differs from the temperature in the rest state, typically room temperature (approximately 22° C.), considerably in some instances. The temperature increase results in a change in the layer thickness of the reflective multilayer coating applied to the optical elements 2a, 5, 6, 8, 9, 10, 14.1 to 14.6, which is illustrated in FIGS. 2a, b by way of example for the first/second mirror 8, 9 of the reflecting telescope 7 along a first direction Y.

Figure 2A:
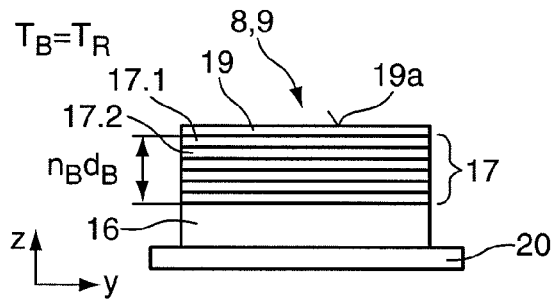

FIG. 2a shows the optical element 8, 9 at room temperature $T_R$, which corresponds to the temperature $T_B$ during the coating of the optical element 8. In this case, the multilayer coating 17 comprising alternating layers 17.1 of molybdenum and silicon 17.2 is applied to a substrate 16 of the optical element 8, 9 by with a thin-film coating method. As can be discerned in FIG. 2a, the optical element 8, 9 has a covering layer 19 applied to the multilayer coating 17 in order to protect the layers 17.1, 17.2 against oxidation, inter alia. The optical surface 19a of the optical element 8 is formed at the top side of the covering layer 19.

Figure 2B:
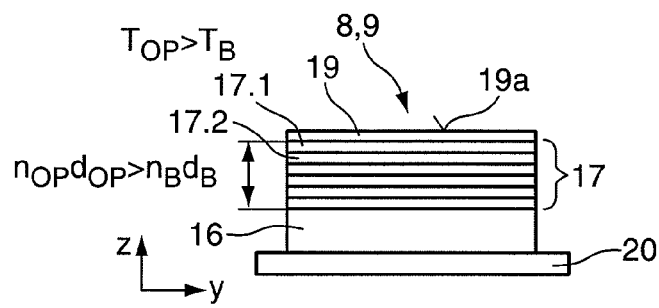

The approximately fifty successive pairs of layers 17.1, 17.2 have, at the coating temperature $T_B$/room temperature $T_R$ (cf. FIG. 2a), overall an optical actual layer thickness $n_B d_B$ that is smaller than an optical desired layer thickness $n_{OP} d_{OP}$ at the operating temperature $T_{OP}$, which is illustrated in FIG. 2b, to be precise because the thicknesses of the layers 17.1 and 17.2 increase depending on the temperature, in which case a linear thermal expansion coefficient $\alpha$ ($\Delta L/L \times 1/\Delta T$) of $0.8 \times 10^{-6}$ 1/K was determined for a multilayer coating 17 comprising fifty alternating layers 17.1, 17.2 of silicon and molybdenum. In this case, the thickness of the covering layer 19 likewise increases, but said covering layer generally does not contribute to the reflection, such that its thickness variation does not bring about a change in the properties of the optical element. In addition, it is assumed hereinafter that the refractive indices $n_R$ at room temperature $T_R$ and $n_{OP}$ at operating temperature $T_{OP}$ correspond to one another, with the result that only a variation of the physical layer thicknesses occurs.

The thermal expansion of the layers 17.1, 17.2 during heating to the operating temperature $T_{OP}$ has the effect that the period length of the multilayer coating 17 increases. As a result of this, the wavelength-dependent maximum of the reflectivity of the multilayer coating 17 is shifted toward higher values. For the six optical elements 2a, 5, 6, 8 to 10 of the illumination system 3, the deviations $\Delta T = T_{OP} - T_R$ of the operating temperature $T_{OP}$ from the room temperature $T_R$, the associated wavelength shifts $\Delta\lambda$ and also the relative wavelength shift $\Delta\lambda/\lambda_0$ relative to an operating wavelength $\lambda_0$ of the projection exposure apparatus 1 of 13.5 nm are listed in the table below:

TABLE

| Mirror No. | $\Delta T$ | $\Delta\lambda$ | $\Delta\lambda/\lambda_0$ |
|---|---|---|---|
| 2a | 620 K | 67.0 pm | 5.0 per mille |
| 5 | 500 K | 54.0 pm | 4.0 per mille |
| 6 | 380 K | 41.0 pm | 3.0 per mille |
| 8 | 250 K | 27.0 pm | 2.0 per mille |
| 9 | 120 K | 13.0 pm | 1.0 per mille |
| 10 | 25 K | 2.7 pm | 0.2 per mille |

Figure 4A:
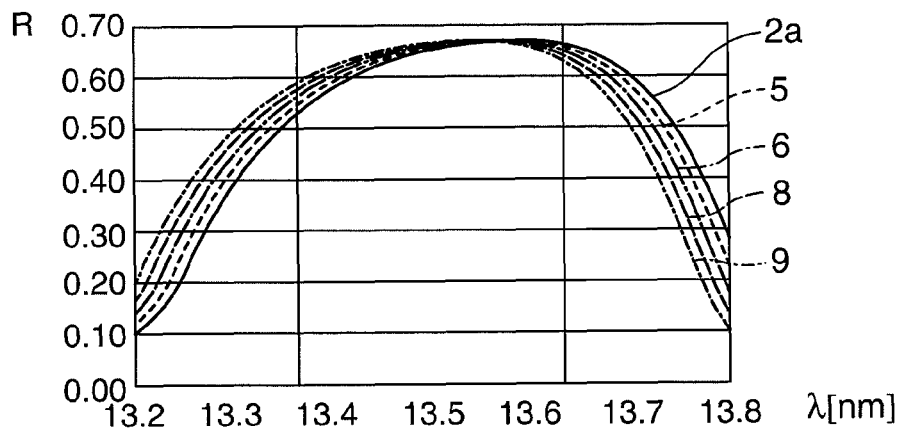
FIGS. 4a-c show the reflectivity of the optical elements of the illumination system from FIG. 1 without thermal compensation (a) the resultant transmission of the illumination system (b) and the total transmission of the EUV lithography system with and without thermal compensation (c), in each case as a function of the wavelength.

FIG. 4a shows the influence of this temperature increase on the optical elements 2a, 5, 6, 8, 9 from the table on the reflectivity R thereof, as a function of the wavelength $\lambda$. The maximum of the reflectivity should here lie in each case at an operating wavelength of $\lambda_0 = 13.6$ nm, but it can clearly be discerned that for optical elements having a higher operating temperature, said maximum is shifted toward higher wavelengths. The vertical lines in FIG. 4a show the limits of the bandwidth of ±1% within which the transmission is usually calculated. The transmission of the illumination system 1 results as the product of the reflectivity curves of the optical elements 2a, 5, 6, 8, 9 from FIG. 4a and the reflectivity curve (not shown) of the optical element 10 having the lowest operating temperature in the illumination system 3.

Figure 4B:
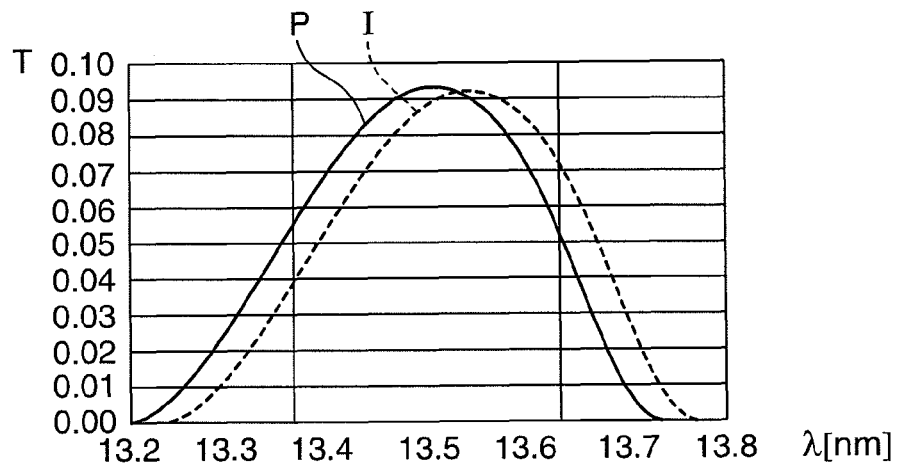

FIG. 4b shows the resulting distribution I of the transmission T of the illumination system 3 as a function of the wavelength $\lambda$. Assuming that the optical elements 14.1 to 14.6 of the projection system 4 are in each case perfectly coordinated with one another, that is to say have a detuning of zero per mille, the distribution P of the transmission T of the projection system 4 as shown in FIG. 4b results from the sixth power of the non-detuned reflectivity curve, that is to say that the maximum of the transmission T of the projection system 4 lies precisely at the operating wavelength $\lambda_0$ of 13.5 nm. In contrast, the maximum of the transmission distribution I of the illumination system 3 is shifted by approximately 30 pm (approximately 2 per mille) toward higher wavelengths.

As already explained in connection with FIGS. 2a, b, the thermal expansion of the layers 17.1, 17.2 in the optical elements of the illumination system 3 can already be provided during the coating, that is to say that the optical design or the thickness $d_B$ of the layers 17.1, 17.2 during production of the multilayer coating 17 is designed taking account of the (linear) thermal expansion coefficient in such a way that given a known temperature difference between the coating temperature $T_B$ and the operating temperature $T_{OP}$, as a result of the thermal expansion, the desired total thickness $d_{OP}$ is established at the operating temperature $T_{OP}$. It should be noted that, as an alternative, the optical element 8, 9 can also be heated to the operating temperature $T_{OP}$ during coating, with the result that the layers 17.1, 17.2 can be applied with an actual layer thickness $d_B$ which is equal to the desired layer thickness $d_{OP}$. For this purpose, a heating element 20 can be provided in the coating apparatus, which heating element can be regulated, in particular, in order to keep the temperature of the optical element 8, 9 at the operating temperature. The coating can be effected with the aid of a conventional method for applying thin layers, e.g. chemical or physical vapor deposition. It should be noted that, instead of the above-described use of a uniform thermal expansion coefficient for both layer materials (Si/Mo), the thermal expansion coefficients of the individual layers 17.1, 17.2 can also be determined separately, such that the reduction of the layer thickness can be defined individually for both materials. Even if interlayers are used for increasing the thermal stability of the multilayer layer system 17, their thermal expansion coefficient can be determined separately and the required reduction of the layer thickness for this layer type can be determined separately. Moreover, the optical element can be measured at operating temperature in order to check whether the optical design has the desired properties, for which purpose it is possible to measure e.g. the reflectivity as a function of the wavelength and/or the angle of incidence. By measuring a plurality of optical (test) elements having different actual layer thicknesses at the operating temperature, it can be ascertained which actual layer thicknesses have to be chosen in order that the desired optical design is established at the operating temperature, without the thermal expansion coefficient having to be determined for this purpose.

Figure 4C:
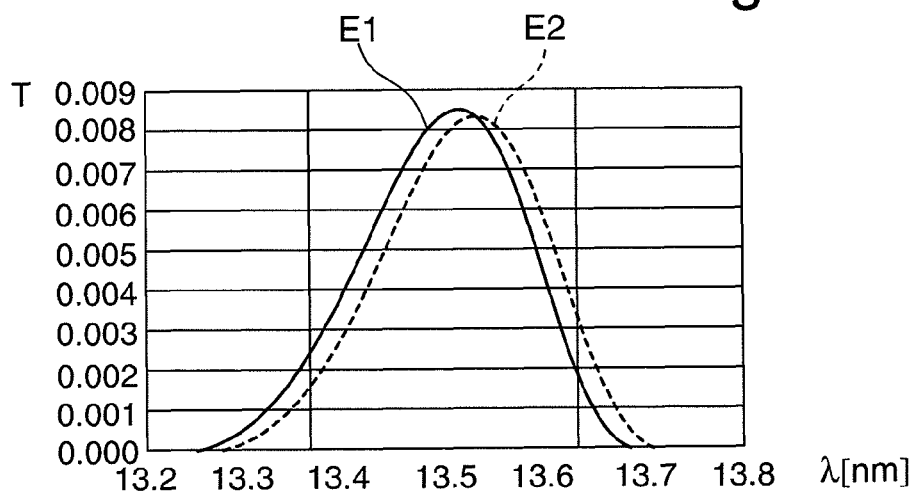

If the optimization of the multilayer coating 17 as described above in connection with FIGS. 2a, b is performed for all the optical elements 2a, 5, 6, 8 to 10 of the illumination system 3, then the transmission curve I illustrated in FIG. 4b is shifted toward shorter wavelengths and substantially corresponds to the transmission curve P of the projection system 4, as is illustrated in FIG. 4c, which shows the total transmission curve E1 of the projection exposure apparatus 1, which results as the product of the transmission curve P from FIG. 4b with itself. If the thermal expansion of the layers in the illumination system 3 is not provided, the total transmission E2 without compensation results as the product of the transmission curve P of the projection system 4 with the transmission curve I of the illumination system 3 from FIG. 4b. In the case of the resulting transmission curve E1 with compensation, a maximum of the transmission T arises at the operating wavelength $\lambda_0$ of 13.5 nm, and in the case of the transmission curve E2 without compensation, the maximum is shifted by approximately 1 per mille toward higher wavelengths.

The transmission loss resulting from the thermal detuning can be calculated in two different ways with reference to FIG. 4c: either the integrals over the full spectral width (full range), or, alternatively, the integrals over a bandwidth of ±1% ("in-band") of the two transmission curves E1, E2 are related to one another. The detuning gives rise to a transmission loss of 3.5% (full range) or of 3.2% (in-band).

The heating of the optical elements 2a, 5, 6, 8, 9, 10, 14.1 to 14.6 in the beam path 15 from room temperature $T_R$, which usually prevails during the rest phases in the projection exposure apparatus 1, to the respective operating temperature $T_{OP}$ by the illumination radiation can last possibly 30 minutes or longer. In order that the optical elements 2a, 5, 6, 8, 9, 10, 14.1 to 14.6 optimized for the operating temperature $T_{OP}$ can be utilized earlier, heating elements 20 (cf. FIGS. 2a, b) e.g. in the form of heating wires or Peltier elements can be fitted to the optical elements 2a, 5, 6, 8, 9, 10, 14.1 to 14.6 of the projection exposure apparatus 1. Furthermore, it is appropriate to provide regulating unit(s) and temperature sensors for temperature regulation in the projection exposure apparatus 1, in order to switch off the heating element when the operating temperature $T_{OP}$ is attained, or to control said heating element in such a way that the temperature of the optical element is operated as close as possible to the operating temperature $T_{OP}$ even in the case of a change in the illumination conditions.

It should be noted that the optimization of the optical properties of optical elements for the operating temperature can be effected not just with regard to the reflectivity, rather that the optimization is alternatively or additionally also possible with regard to other criteria, in particular with regard to imaging aberrations of the projection exposure apparatus 1. This applies in particular to optical elements of the illumination system 3 which are arranged in the beam path 15 downstream of the combination—serving as light mixing device—of the mirror 5 with field raster elements and the mirror 6 with pupil raster elements.

Figure 5:
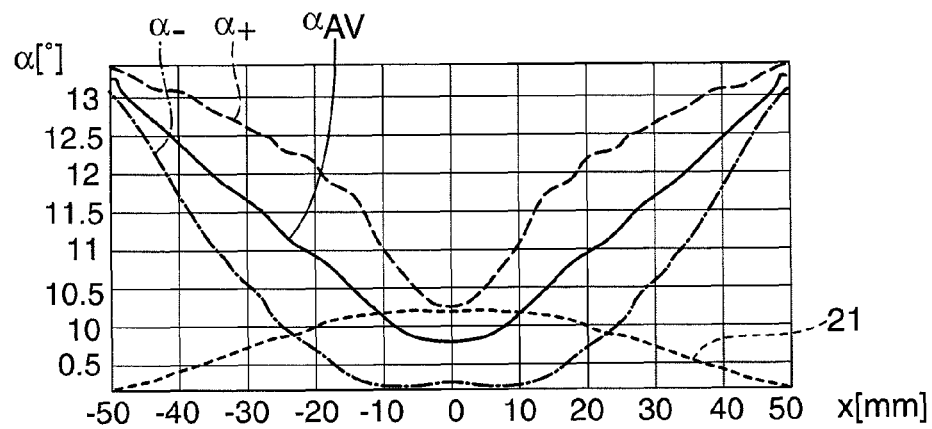
FIG. 5 shows a schematic illustration of the angle loading of one of the optical elements of the illumination system from FIG. 1 along a second direction, and FIGS. 6a,b show the uniformity in an object plane of the illumination system from FIG. 1 without thermal compensation (a) at operating temperature and with provision of thermal compensation (b) at room temperature.

FIG. 5 shows the average angle $\alpha_{AV}$ of incidence, and also the 3σ deviation $\alpha_+$ and $\alpha_-$ of the angle of incidence upward and downward, respectively, around the average angle $\alpha_{AV}$ of incidence, against a field coordinate x of the optical element 8, 9 of the illumination system 3, which optical element is operated with normal incidence. As can be seen from FIG. 5, this has a great variation of the average angle $\alpha_{AV}$ of incidence along the x direction and a large local angle-of-incidence bandwidth $\alpha_+$ and $\alpha_-$ in this direction, which results in a distribution 21 of the beam intensity of the impinging radiation that is concentrated in the center of the optical element 8, 9. The optical element 8, 9 is an element near the field along the x direction, that is to say that the x coordinates of the optical surface of the optical element 8, 9 substantially correspond to x coordinates in the object plane 11 of the projection exposure apparatus 1.

Figure 6A:
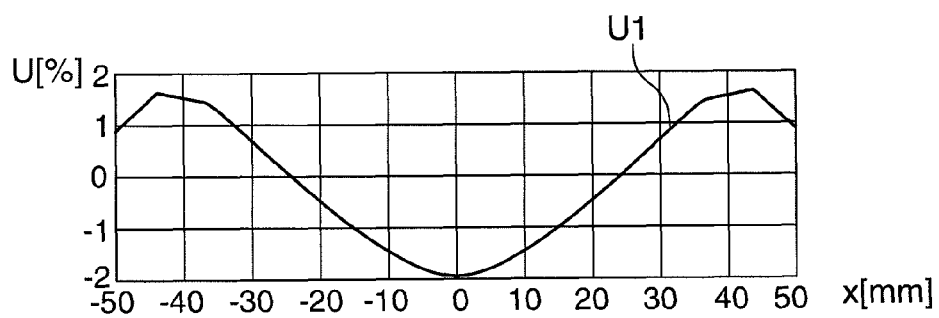
Figure 6B:
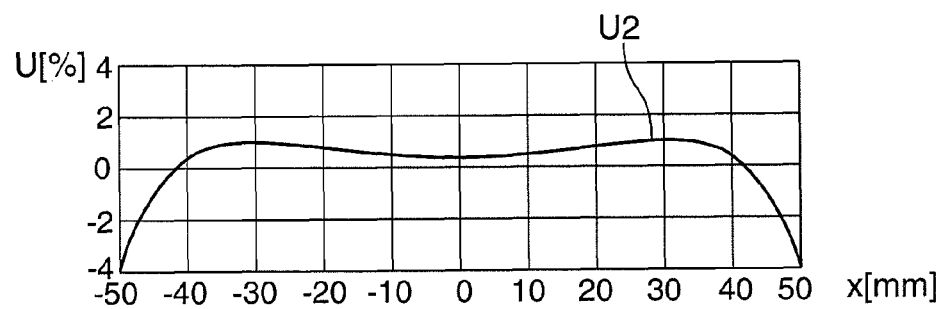

Assuming a thermally governed detuning of the wavelength of the maximum of the reflectivity as a result of a change in the period length of the multilayer system 17 of +2 per mille, the uniformity U1 in the object plane 11 deteriorates by ±2% in a field-dependent manner, as is illustrated in FIG. 6a. In the case of a negative detuning of −2 per mille (that is to say that the thermal expansion is provided but the illumination system 3 is operated in a cold state (at room temperature $T_R$)), the uniformity U2 deteriorates principally at the edge of the field by approximately −4%, cf. FIG. 6b. These changes in the uniformity are substantially independent of the illumination settings used, for which an average value is respectively illustrated in FIGS. 6a, b. Further imaging properties, e.g. the ellipticity and telecentricity, can also be affected by the detuning of the optical element 8, 9, albeit generally to a smaller extent than is the case for the uniformity.

Figure 3A:
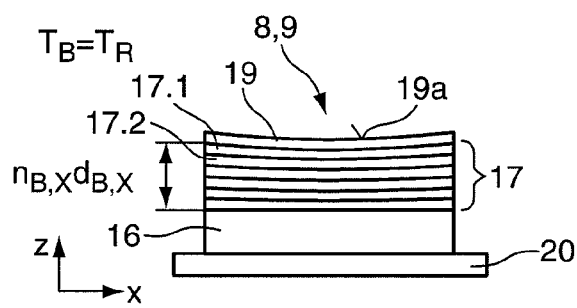
Figure 3B:
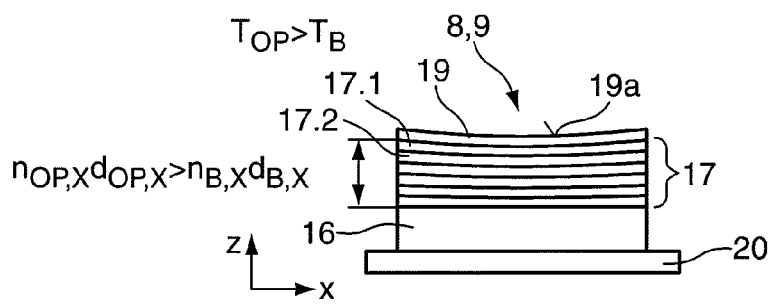

As can be gathered from FIG. 5 and FIGS. 6a, b, a homogeneous reduction of the thickness of the layers 17.1, 17.2 in the x direction does not suffice to achieve a high uniformity of the illumination field since the intensity distribution 21 and hence the temperature distribution on the optical element in the x direction is inhomogeneous. As is illustrated in FIGS. 3a, b, for compensation purposes, the layers 17.1, 17.2 can be applied with a lateral layer thickness gradient in this direction (x direction), that is to say that the thickness $d_{B,x}$ of the layers 17.1, 17.2 during coating is dependent on the location in the x direction, the local actual layer thickness $d_{B,x}$ being chosen in such a way that a local layer thickness change $d_{OP,x}-d_{B,x}$, caused by thermal expansion of the layers 17.1, 17.2 between the coating temperature $T_B$ and the operating temperature $T_{OP}$ is precisely compensated for, it once again being assumed here for simplification that the refractive indices $n_{B,x}$ at room temperature and $n_{OP,x}$ at operating temperature are identical. Consequently, both a global portion of the thermal expansion and a local portion are taken into account by determining the actual layer thicknesses $d_{B,x}$ for the coating temperature $T_B$. In this way, it is possible to achieve a uniformity in the x direction in the object plane whose magnitude is less than approximately 1 to 2%.

In the case of the resulting multilayer coating 17 at operating temperature $T_{OP}$, the layers 17.1, 17.2 have a desired layer thickness $D_{OP,x}$ depending on the location in the x direction which is chosen in such a way that the reflectivity of the optical element 8, 9 is optimized for the average angle $\alpha_{AV}$ of incidence that varies greatly in the x direction and is shown in FIG. 5. The angle of incidence averaged over all locations of the optical surface 19a in the x direction is typically between approximately 10° and 15° in the case of the optical element 8, 9.

It should be noted that the optimization described above is not restricted to the optical element 8, 9, but rather can e.g. also be necessary at the optical elements 14.1 to 14.6 of the projection system 4, since even a temperature increase of just 25K already results in a shift in the wavelength by 2.7 pm (0.2 per mille). An optimization of the facet mirrors 5, 6 of the illumination system 3 is also possible, and in this case an independent optimization with layer thicknesses that are constant over the individual mirror can be effected for each individual mirror (not shown in FIG. 1), which can result in a local optimization if the layer thicknesses of different individual mirrors are chosen differently, with respect to the entire optical surface of the facet mirrors 5, 6. It furthermore should be noted that, if appropriate, deformations of the substrate 16 which can occur during the heating of the optical elements to the respective operating temperature $T_{OP}$ can also be compensated for by a suitable choice of the layer thicknesses, which is variable in a location-dependent manner, in the case of the coating. In particular, the substrates of the optical elements do not necessarily have to be plane, but rather can have an elliptical or parabolic basic form.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for producing a multilayer coating comprising a plurality of layers for reflecting radiation in the soft X-ray or extreme-ultra-violet wavelength range on an optical element which has an optical surface and is operated at an operating temperature ($T_{OP}$) of at least 30° C., comprising:
    determining an optical design for the multilayer coating which defines an optical desired layer thickness ($n_{OP} d_{OP}$) of the layers of the multilayer coating at the operating temperature ($T_{OP}$), and
    applying the layers of the multilayer coating with an optical actual layer thickness ($n_B d_B$) selected such that a layer thickness change ($n_{OP} d_{OP} - n_B d_B$) caused by thermal expansion of the layers between a coating temperature ($T_B$) and the operating temperature ($T_{OP}$) is compensated, wherein at least one of:
        the optical design of the multilayer coating of the optical element is at least substantially optimized with regard to reflectivity of the optical element for an operating wavelength ($\lambda_0$) at the operating temperature ($T_{OP}$) and
        the operating temperature ($T_{OP}$) of the optical element varies at least in one direction along the optical surface and, during the coating of the optical element the layers are applied with actual layer thicknesses ($d_{B,x}$) which vary along the at least one direction.

2. The method as claimed in claim 1, wherein, for determining the layer thickness change ($n_{OP} d_{OP} - n_B d_B$) a linear thermal expansion coefficient of the layers of the multilayer coating is determined or at least one optical property of the optical element is measured at the operating temperature ($T_{OP}$).

3. The method as claimed in claim 1, wherein the optical actual layer thickness ($n_B d_B$) is selected to at least substantially equal the optical desired layer thickness ($n_{OP} d_{OP}$), and the coating of the optical element is effected at at least substantially the operating temperature ($T_{OP}$).

4. An optical element comprising: a multilayer coating for reflecting radiation in the soft X-ray or extreme-ultraviolet wavelength range, and provided for operation in a beam path of an optical arrangement at an operating temperature ($T_{OP}$) of at least 30° C.,
    wherein an optical design of the multilayer coating is at least substantially optimized with regard to a reflectivity (R) of the optical element for a given operating wavelength ($\lambda_0$), at the operating temperature ($T_{OP}$).

5. The optical element as claimed in claim 4, wherein a wavelength ($\lambda$) of a maximum value of the reflectivity (R) of the optical element at the operating temperature ($T_{OP}$) corresponds to the operating wavelength ($\lambda_0$), the wavelength ($\lambda$) of the maximum value of the reflectivity (R) of the optical element at the operating temperature ($T_{OP}$) being shifted relative to the wavelength ($\lambda$) of the maximum value of the reflectivity (R) of the optical element at room temperature ($T_R$) by more than 2 per mille, with respect to the operating wavelength ($\lambda_0$).

6. The optical element as claimed in claim 4, wherein the reflectivity (R) of the optical element at the operating temperature ($T_{OP}$) is maximized for an average angle of light incidence which lies between 0° and 30°.

7. An optical arrangement, comprising:
    an illumination system arranged to illuminate an object plane,
    a projection system arranged to image a structure in the object plane into an image plane and
    at least one optical element as claimed in claim 4 and arranged in a beam path of the optical arrangement.

8. The optical arrangement as claimed in claim 7, wherein the at least one optical element is designed such that at least one imaging aberration of the optical arrangement at the operating temperature ($T_{OP}$) of the optical element is at least substantially optimized.

9. The optical arrangement as claimed in claim 8, wherein the imaging aberration is selected from the group consisting of: telecentricity, uniformity, pupil ellipticity and pupil apodization.

10. The optical arrangement as claimed in claim 9, wherein a gradient, in at least one direction, of layer thicknesses ($d_{OP, x}$) of layers of the multilayer coating of at least one optical element arranged in the illumination system is selected such that, at the operating temperature ($T_{OP}$) of the optical element, an absolute value of uniformity (U) in an object plane of the optical arrangement in the at least one direction is less than 5%.

11. The optical arrangement as claimed in claim 7, wherein the at least one optical element comprises a plurality of optical elements which, during operation of the optical elements with respective operating temperature ($T_{OP}$) for the operating wavelength ($\lambda_0$), has a maximum total transmission which is increased by at least 2% relative to operation of the optical elements at room temperature ($T_R$).

12. The optical arrangement as claimed in claim 7, wherein at least two optical elements that succeed one another in the beam path have differing respective operating temperatures ($T_{OP}$) during operation of the optical arrangement.

13. The optical arrangement as claimed in claim 7, further comprising at least one heating element configured to heat an optical surface of the at least one optical element to the operating temperature ($T_{OP}$).

14. An optical element comprising: a multilayer coating comprising a plurality of layers, for reflecting radiation in the soft X-ray or extreme-ultraviolet wavelength range, and provided for operation in a beam path of an optical arrangement at an operating temperature ($T_{OP}$) of at least 30° C.,
   wherein an optical design of the multilayer coating is at least substantially optimized with regard to at least one temperature-dependent optical property,
   wherein the operating temperature ($T_{OP}$) varies at least in one direction along an optical surface of the optical element, and wherein the multilayer coating, for optimizing the at least one optical property has a gradient of layer thicknesses ($d_{B,x}$) of the layers of the multilayer coating in the at least one direction.

15. The optical element as claimed in claim 14, embodied as a facet mirror and further comprising a plurality of individual mirrors, at least one optical property of each of the respective individual mirrors being at least substantially optimized at the operating temperature ($T_{OP}$).

16. An optical arrangement, comprising:
   an illumination system arranged to illuminate an object plane,
   a projection system arranged to image a structure in the object plane into an image plane and
   at least one optical element as claimed in claim 14 and arranged in a beam path of the optical arrangement.

* * * * *

UNITED STATES PATENT AND TRADEMARK OFFICE
CERTIFICATE OF CORRECTION

PATENT NO. : 8,457,281 B2  Page 1 of 1
APPLICATION NO. : 12/965280
DATED : June 4, 2013
INVENTOR(S) : Hartmut Enkisch, Stephan Muellender and Martin Endres It is certified that error appears in the above-identified patent and that said Letters Patent is hereby corrected as shown below:

In the Specifications:

Column 1, Line 12: delete "and the" and insert -- and to --

In the Claims:

Column 13, Line 39: In Claim 1, delete "extreme-ultra-violet" and insert -- extreme-ultraviolet --

Signed and Sealed this
Twenty-ninth Day of April, 2014

Michelle K. Lee
*Deputy Director of the United States Patent and Trademark Office*